United States Patent [19]

Hirayama et al.

[11] Patent Number: 4,939,402

[45] Date of Patent: Jul. 3, 1990

[54] DRIVING CIRCUIT FOR DRIVING A PIEZOELECTRIC VIBRATOR

[75] Inventors: Hiromitsu Hirayama, Funabashi; Takashi Urano, Ichihara; Minoru Takahashi, Funabashi, all of Japan

[73] Assignee: TDK Corporation, Tokyo, Japan

[21] Appl. No.: 355,457

[22] Filed: May 19, 1989

[30] Foreign Application Priority Data

May 19, 1988 [JP] Japan ................................ 63-120708

[51] Int. Cl.[5] ........................ H01L 41/08; H02M 3/335

[52] U.S. Cl. ..................................... 310/316; 310/317; 363/21; 363/97

[58] Field of Search ................ 310/314, 316, 317, 318, 310/319; 363/20, 21, 97, 131

[56] References Cited

U.S. PATENT DOCUMENTS

| | | | |
|---|---|---|---|
| 4,275,363 | 6/1981 | Mishiro et al. | 310/316 |
| 4,562,413 | 12/1985 | Mishiro et al. | 310/316 |
| 4,562,523 | 12/1985 | Rödel et al. | 363/21 |
| 4,626,728 | 12/1986 | Flachenecker et al. | 310/316 |

*Primary Examiner*—Peter S. Wong
*Attorney, Agent, or Firm*—Fleit, Jacobson, Cohn, Price, Holman & Stern

[57] ABSTRACT

A single transistor type driving circuit for a piezoelectric vibrator. The driving circuit includes a transformer having a primary winding and a secondary winding, a single switching transistor connected in series with the primary winding, the piezoelectric vibrator being connected with the secondary winding, a transistor driving circuit for applying driving current to the switching transistor so that the switching transistor is alternately turned on and off to thereby drive the vibrator at or in the vicinity of a resonating frequency of the vibrator. A coil is connected in series with the piezoelectric vibrator so that current and voltage of sinusoidal form are applied to the vibrator. A phase comparator compares phase of the sinusoidal current at the piezoelectric vibrator with phase of voltage at the secondary winding of the transformer to produce a phase difference signal, and the frequency of the driving current is controlled in accordance with the phase difference signal.

7 Claims, 5 Drawing Sheets

DRIVING CIRCUIT FOR DRIVING A PIEZOELECTRIC VIBRATOR

BACKGROUND OF THE INVENTION

1. Field of the Invention

The present invention relates to a driving circuit for driving a piezoelectric vibrator. More particularly, the present invention pertains to a single-transistor type driving circuit for driving a piezoelectric vibrator.

2. Description of the Prior Art

In Japanese patent application Sho No. 61-309113 which has been filed on Dec. 27, 1986 and disclosed for public inspection on July 11, 1988 under the disclosure No. 63-167098 there is disclosed an ultrasonic liquid pump which is similar in structure to a bolted Langevin type vibrator and can by itself pump and atomize the liquid. In this type of liquid pump, the liquid to be pumped constitute the load on the pump so that the load is changed in response to a change in the liquid level. Such load change results in a change in the resonating frequency of the vibrator. In order to drive the vibrator with a high efficiency, it is therefore necessary to control the frequency of the driving voltage applied to the driving circuit. In other types of vibrators, the resonating frequency will be changed depending on the load applied thereto. In the case of a piezoelectric vibrator, the resonance point will change even in response to a change in the driving voltage. It is therefore required in these vibrators to control the driving frequency in accordance with a change in the resonance point.

Hithertofore, several types of driving circuits are known for driving a piezoelectric vibrator. Such driving circuits include a two transistor type such as a push-pull type and a half bridge type as well as a single transistor type such as an A-class amplifier, an oscillator and a switching circuit. In order to control the driving frequency in response to a change in the resonance point of the vibrator, a proposal is made to use an equivalent impedance portion provided by the vibrator at a region between the resonating frequency and the non-resonating frequency as in a Colpitz oscillator. Alternatively, it is also proposed to control in accordance with the minimum impedance which appears at the resonance point of the vibrator. Examples of the alternative control are the one in which control is made so that the current through the vibrator is maximized and the one in which the current and the voltage in the vibrator are detected and a control is made so that the current and the voltage have the same phase.

Referring to FIG. 5, there is shown an example of a conventional two transistor type push-pull driving circuit which includes a pair of transistors Q2 and Q3 connected with a primary winding of an output transformer T2 in a push-pull relationship. The transformer T2 has a secondary winding which is connected with a piezoelectric vibrating element TD. The transistors Q2 and Q3 have bases which are applied with driving voltage of opposite phase. The primary winding of the transformer T2 has an intermediate terminal which is connected with a bus voltage VB.

FIG. 6 shows an example of a conventional half bridge type driving circuit which includes a pair of transistors Q4 and Q5 connected in series between terminals leading to the power source VB. Between the terminals from the power source VB, there are a pair of capacitors C1 and C2 which are connected in series. The output transformer T3 has a primary winding connected on one hand with a connection between the transistors Q4 and Q5 and on the other hand with a connection between the capacitors C1 and C2. The transformer T3 has a secondary winding which is connected with a piezoelectric vibrating element TD. The transistors Q4 and Q5 have bases which are applied with driving voltage of opposite phase.

It has been recognized that the driving circuits shown in FIGS. 5 and 6 are suitable for a piezoelectric vibrator having a large power consumption. It should however be noted that the circuit requires two transistors and two driving signals of opposite phase so that the arrangements are complicated as compared with a single transistor type circuit. Further, this type of circuit is disadvantageous in that a reverse electromotive power produced in the piezoelectric vibrator influences from the secondary winding to the primary winding of the transformer to prevent the transistor from being switched from the on state to the off state. This will have an adverse effect on an effort of improving the efficiency of the circuit. It should further be noted that in an arrangement wherein any fluctuation of the source voltage is compensated for through a control of the pulse width of the driving signal, the operation may become unstable due to the aforementioned reverse electromotive power.

Referring to FIG. 7, there is shown a conventional driving circuit of a single transistor type in which a transistor Q5 is connected with the source voltage VB in series with the primary winding of the output transformer T4. The secondary winding of the transformer is connected with a piezoelectric vibrator TD. The circuit shown in FIG. 7 is considered to be advantageous over the two transistor type in that the circuit arrangement is simple and the control can be readily carried out in response to a change in the source voltage by changing the pulse width of the driving signal. The circuit however is difficult for use with a vibrator of a large power consumption because the transistor will be subjected to a substantial load. Since there is no transistor which can absorb the reverse electromotive power produced in the vibrator TD, the collector of the transistor may be subjected to a voltage of a substantial value. Therefore, the transistor must be of a high voltage type.

The Colpitz oscillator is known as a type which utilizes for the driving circuit control an equivalent inductance which the vibrator provides at an intermediate region between the resonating frequency and the non-resonating frequency of the vibrator. The Colpitz type oscillator is widely used in an oscillating circuit and mostly uses a quartz oscillator. A piezoelectric element is similar to a quartz oscillator in many aspects, however, in a certain property, the former is different from the latter. More specifically, referring to FIG. 8 which shows an impedance change in response to a frequency change, it should be noted that there is a substantial difference between the resonance frequency fr and the non-resonance frequency far in the case of a piezoelectric element. For this reason, it is practically impossible to obtain a high stability.

It should further be noted that the single transistor type circuit applied in the manner similar to the Colpitz oscillator is not suitable for driving a ultrasonic pump having a structure similar to that of a bolted Langevin oscillator and adapted for pumping and atomizing liquid. Further, the circuit of this type is not suitable for an application to a ultrasonic machining apparatus or to a ultrasonic welding machine which requires a high electric power. The circuit of this type is designed to drive the vibrator at a frequency between the resonating frequency and the non or anti-resonance frequency so that the system cannot be operated under the resonating frequency under which a most efficient driving can be accomplished.

In a driving circuit of the type in which the control is carried out based of the minimum impedance at the resonance point of the vibrator, the circuit may include a transistor type switching device. In this type, however, difficulty of control is in practice encountered since voltage or current of a sinusoidal form is not applied to the piezoelectric element. It is therefore desirable to provide a driving circuit in which a high frequency output of a sinusoidal form is produced. It should however be noted that with an output of a sinusoidal form it is impossible to have the output transistor operated under a high efficiency.

A switching circuit may be provided in the driving circuit so that the efficiency of the output transistor can be increased. In this arrangement, however, the current and the voltage at the vibrator will be of distorted configurations so that it becomes practically impossible to control the current and the voltage so that they have the same phase. It may be considered to carry out the control so that the current at the piezoelectric element is maintained at a maximum value. However, this solution is not satisfactory because it is difficult to detect the maximum value of the current due to the distorted form of the current. Further, there is a possibility that the maximum value of the vibrating element changes from time to time and also depending on the load so that the control becomes further difficult.

SUMMARY OF THE INVENTION

It is therefore an object of the present invention to provide a driving circuit for driving a piezoelectric vibrator which is simple in structure but can be operated with a high efficiency and a high stability.

Another object of the present invention is to provide a single transistor type driving circuit for driving a piezoelectric vibrator in which a precise and accurate control can be accomplished.

A further object of the present invention is to provide a single transistor type driving circuit which can be used for a high power piezoelectric vibrator.

According to the present invention, in order to accomplish the above and other objects, improvements are made on a driving circuit including transformer means having primary winding means and secondary winding means, switching transistor means connected in series with said primary winding means, piezoelectric vibrating means connected with said secondary winding means, transistor driving means for applying driving current to said switching transistor means so that the switching transistor means is alternately turned on and off to thereby drive said vibrating means at or in the vicinity of a resonating frequency of the vibrating means. The improvement comprises coil means connected in series with the piezoelectric vibrating means so that current and voltage of sinusoidal form are applied to the vibrating means, phase comparator means for comparing phase of the sinusoidal current at the piezoelectric vibrating means with phase of voltage at the secondary winding means of the transformer means to produce a phase difference signal, and means for controlling frequency of the driving current in accordance with the phase difference signal. In a preferable feature of the present invention, the frequency of the driving current is controlled in such a manner that the timing in which the voltage at the secondary winding means is changed from a state corresponding to the ON state of the transistor means to the OFF state coincides with the timing in which the sinusoidal current at the piezoelectric vibrating means assume zero value. The sinusoidal current at the vibrating means has a frequency which is identical with the resonating frequency of the piezoelectric vibrating means during the period corresponding to the off state of the transistor means. Where the driving frequency is far apart from the resonating frequency, the first mentioned timing will be far apart from the second mentioned timing. To the contrary, where there is a coincidence between driving frequency and the resonating frequency, the first mentioned timing will coincide with the second mentioned timing. The control of the driving current and the voltage may be accomplished by changing a duty factor of the driving current.

The above and other objects and features of the present invention will become apparent from the following description of a preferred embodiment taking reference to the accompanying drawings.

DESCRIPTION OF THE PREFERRED EMBODIMENT

Figure 1:
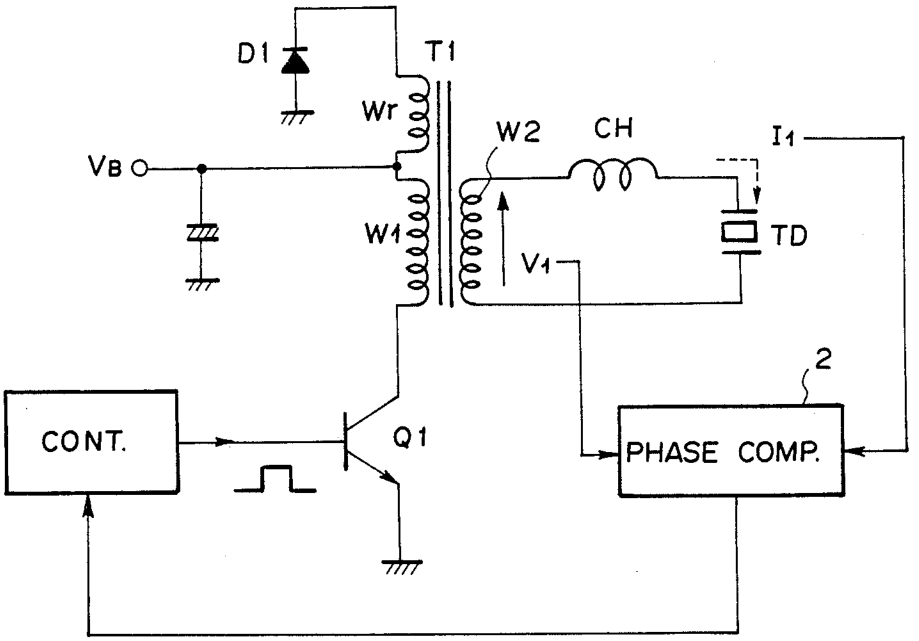
FIG. 1 is a circuit diagram showing a basic concept of the present invention.

Referring first to FIG. 1 which shows the basic concept of the present invention, it will be noted that the driving circuit in accordance with the present invention includes an output transformer T1 which has a primary winding W1 and a secondary winding W2. A reset winding Wr is connected at one end with one end of the primary winding W1. The other end of the reset winding Wr is grounded through a diode D1. The said one end of the primary winding W1 is connected with a terminal VB leading to a power source. The other end of the primary winding W1 is connected with a transistor Q1 which has a base connected with a control oscillator 1. The oscillator 1 produces output pulses which is applied to the base of the transistor Q1. The secondary winding W2 is connected with a piezoelectric vibrator TD. A coil CH is connected in series with the vibrator TD. There is provided a phase comparator 2 which is connected with the secondary winding W2 and the vibrator TD to detect the phase of the voltage V1 at the secondary winding W2 and the phase of the current $I_1$ at the vibrator TD. The phase comparator 2 functions to compare the phase of the voltage at the secondary winding of the transformer T1 with the phase of the current at the vibrator TD and produces a signal which is applied to the control oscillator 1 to thereby control the frequency of the pulse applied to the transistor Q1.

It will be noted that the driving current applied to the transistor Q1 is of a rectangular form so that a voltage of a rectangular form is produced at the secondary winding W2. By appropriately determining the inductance of the coil CH, it is possible to make the voltage across the vibrator TD and the current through the vibrator TD in sinusoidal waveforms. There will be a difference in phase between the voltage and the current at the vibrator TD.

Figure 2A:
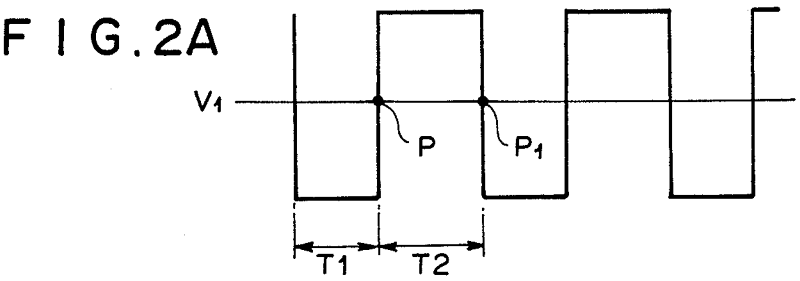
FIG. 2A is a diagram showing the waveform of the current at the secondary winding of the transformer.
Figure 2B:
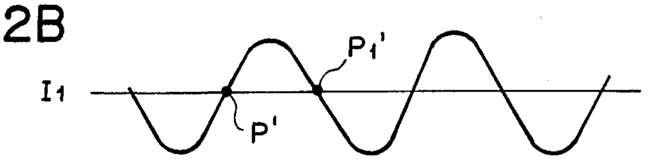
FIG. 2B is a diagram showing the waveform of the current at the piezoelectric vibrator.

The driving frequency is controlled in accordance with the load on the vibrator TD, the temperature condition, the source voltage, etc., because such factors cause changes in the resonant point. This control is carried out based on a phase comparison between the rectangular voltage V1 across the secondary winding W2 of the transformer T1 and the sinusoidal current $I_1$ at the vibrator TD. Referring to FIG. 2A, the timing P corresponding to the switching from the ON state to the OFF state of the transistor Q1 is taken as a reference. At this timing P, there will be a voltage increase in the secondary winding W2 due to the switching of the transistor Q1 from the ON state to the OFF state. In addition, the timing P' in FIG. 2B is taken as a further reference. At this timing P', the current $I_1$ through the vibrator TD crosses the zero value line. The control of the driving frequency is made so that the timings P and P' substantially coincide each other. It has been recognized that the current $I_1$ through the vibrator TD has a frequency which coincides with the resonating frequency fr of the vibrator TD during the OFF state of the transistor Q1 and the timings P and P' will be far apart if the driving frequency is far apart from the resonating frequency of the vibrator TD. The timings P and P' coincide each other when the driving frequency coincides with the resonating frequency of the piezoelectric vibrator TD. The timings P and P' can be made to coincide by changing the duty factor of the driving current applied to the transistor Q1. The duty factor can be represented by the ratio $T_1/(T_1+T_2)$ in FIG. 2A.

Figure 3:
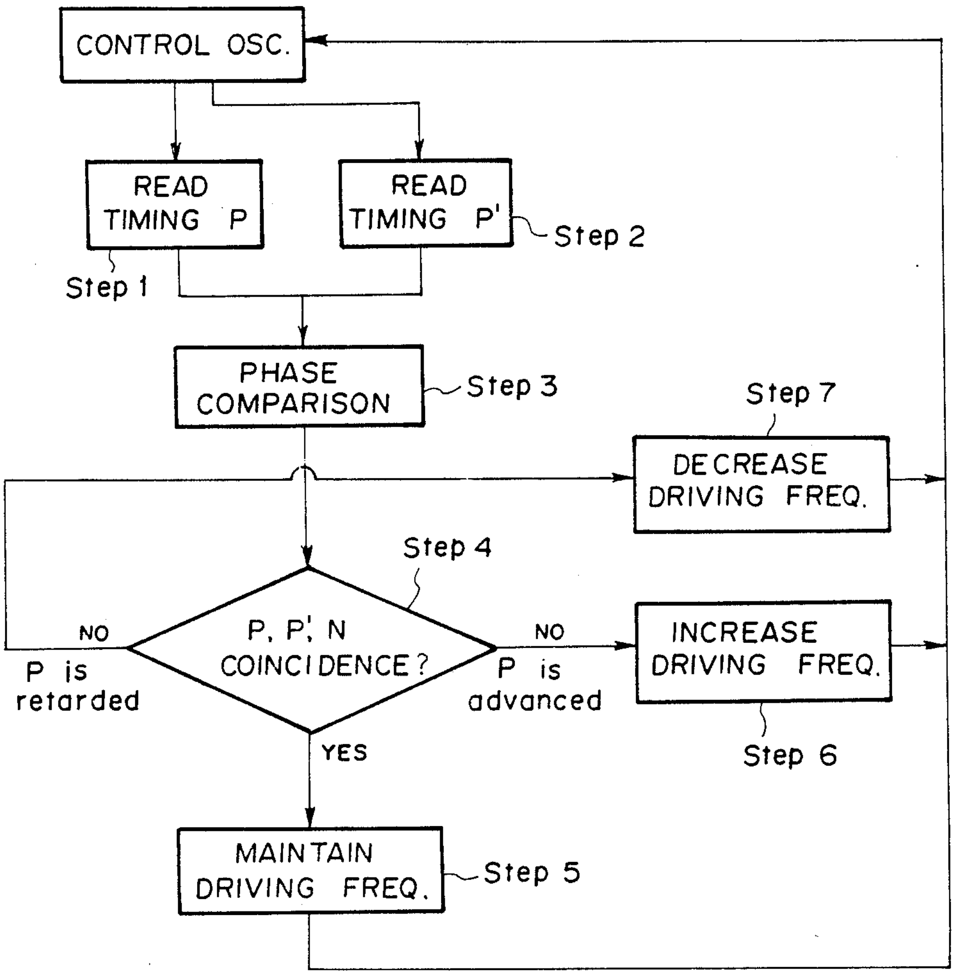
FIG. 3 is a flow chart showing the control of the oscillator for producing the transistor driving current.

Referring to FIG. 3, there is shown an example of the control for the control oscillator 1. In the step 1, the timing P is read and then in the step 2 the timing P' is read. Then, the phase comparison is carried out in the step 3. A judgement is thereafter made in the step 4 as to whether the timings P and P' are in coincidence. If the answer is YES, the driving frequency is maintained as it is in the step 5. If the timing P is advanced than the timing P', the driving frequency is increased in the step 6. If the timing P is retarded than the timing P', the driving frequency is decreased in the step 7.

Figure 4:
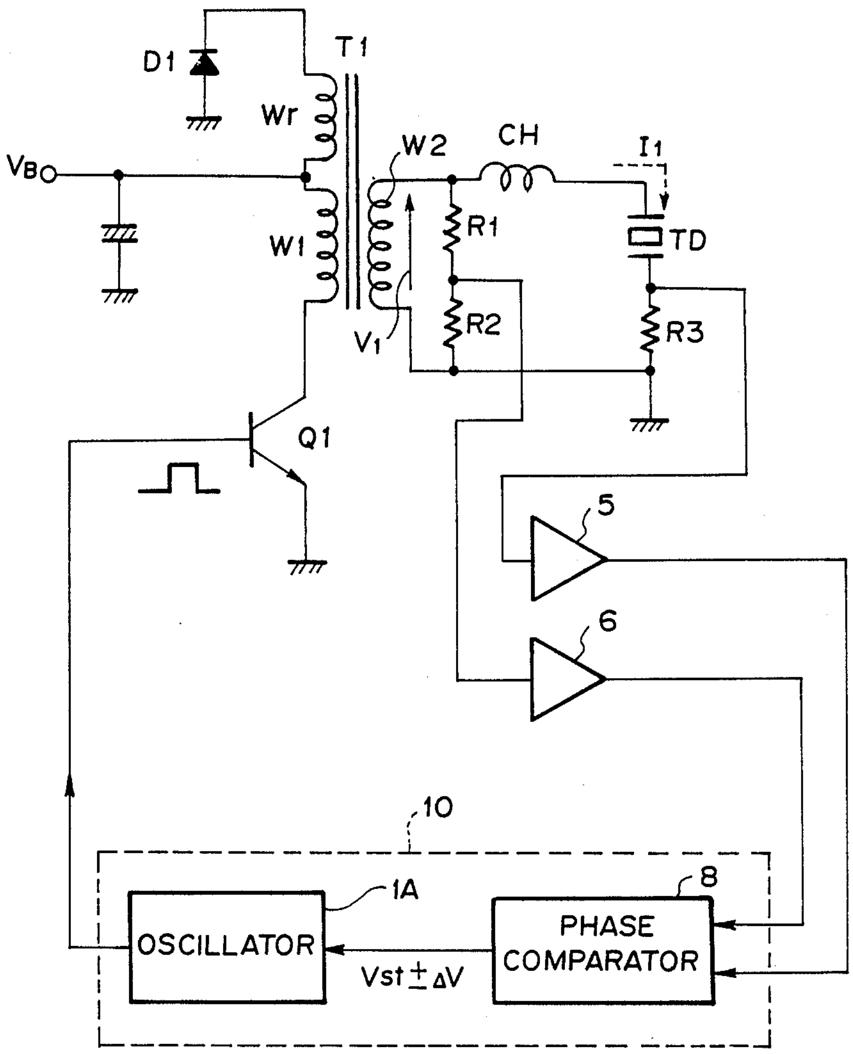
FIG. 4 is a circuit diagram showing the details of the driving circuit in accordance with one embodiment of the present invention.
Figure 5:
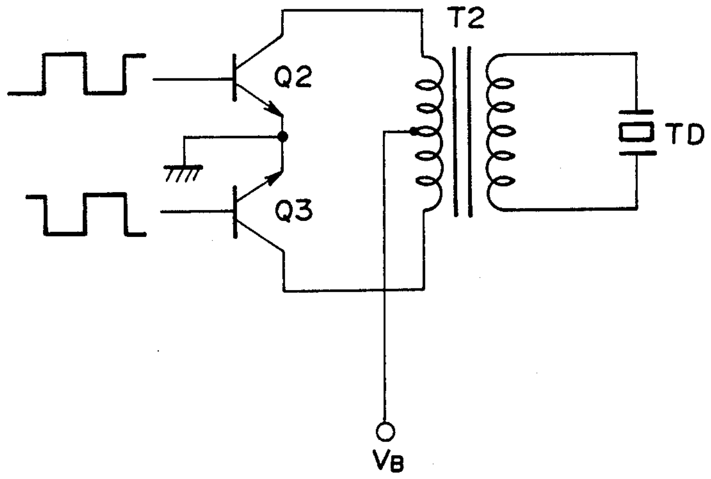
FIG.5 (PRIOR ART)
FIGS. 5 through 7 are circuit diagrams showing examples of conventional driving circuits; and, FIG. 8 is a diagram showing the relationship between the impedance and the frequency in a piezoelectric element.
Figure 6:
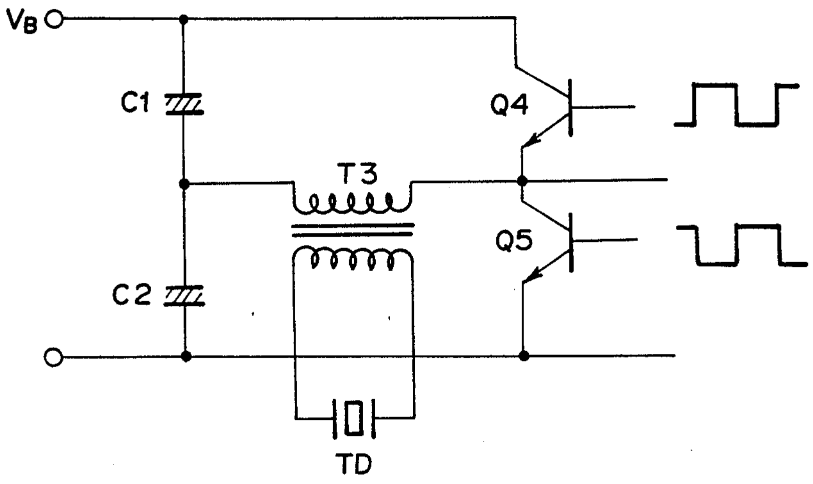
FIG.6 (PRIOR ART)
Figure 7:
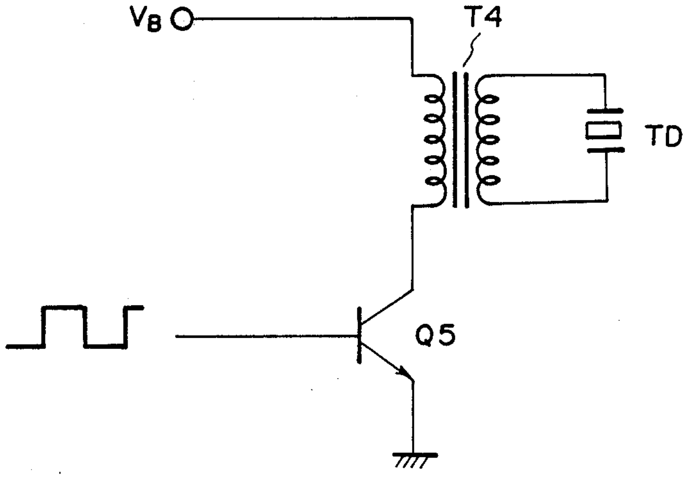
FIG.7 (PRIOR ART)
Figure 8:
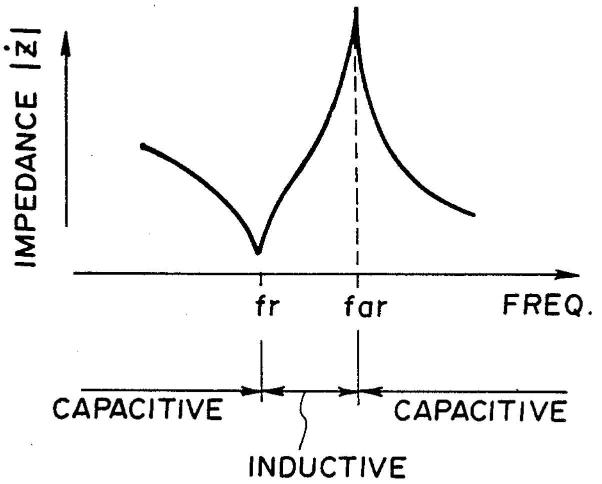

Referring now to FIG. 4, there is shown a driving circuit which includes an integrated circuit 10 having a voltage control oscillator 1A and a phase comparator 8 which are arranged to constitute a PLL loop. Across the secondary winding W2 of the transformer T1, there is a voltage divider constituted by resistors R1 and R2 ad connected with a waveform shaping circuit 6. The output of the circuit 6 is connected with the phase comparator 8 to apply the comparator 8 a signal representing the phase of the voltage at the secondary winding W2. The piezoelectric vibrator TD is grounded through a resistor R3 and the connection between the vibrator TD and the resistor R3 is connected with a waveform shaping circuit 5. The output of the circuit 5 is connected with the phase comparator 8 to apply the comparator with an information on the phase of the current through the vibrator TD. The waveform shaping circuit 6 functions to produce a pulse signal representing the timing P which corresponds to the timing in which the transistor Q1 is turned from the ON state to the OFF state. The waveform shaping circuit 5 functions to produce a pulse representing the timing P' which is the timing where the current $I_1$ through the vibrator TD crosses the zero value line.

The phase comparator 8 produces a constant reference voltage Vst when the timings P and P' are in coincidence. If the timings P and P' are not in coincidence, the comparator 8 produces a difference signal dV in addition to the reference voltage Vst. The reference signal dV may take a positive or negative value depending on the direction of offset of the timing P with respect to the timing P'. The output of the comparator 8 is applied to the oscillator 1A. In the case where the difference signal is produced, the driving frequency produced by the oscillator 1A is changed so that the timings P and P' coincide each other. In detecting the current $I_1$, a secondary winding may be provided adjacent the coil CH and a voltage induced in the secondary winding may be detected.

Referring again to FIGS. 3A and 3A, it will be noted that the timing P1 which corresponds to the timing wherein the transistor Q1 is turned from the OFF state to the ON state and the timing P1, wherein the current $I_1$ crosses the zero value line may be taken as references for the control of the driving frequency.

The invention has thus been shown and described with reference to a specific embodiment, however, it should be noted that the invention is in no way limited to the details of the illustrated structures but changes and modifications may be made without departing from the scope of the appended claims.

We claim:

1. A driving circuit for a piezoelectric vibrator including transformer means having primary winding means and secondary winding means, switching transistor means comprising a single transistor connected in series with said primary winding means, piezoelectric vibrating means connected with said secondary winding means, transistor driving means for applying driving current to said switching transistor means so that the switching transistor means is alternately turned on and off to thereby drive said vibrating means at or in the vicinity of a resonating frequency of the vibrating means, the improvement comprises coil means connected in series with the piezoelectric vibrating means so that current and voltage of sinusoidal form are applied to the vibrating means, phase comparator means for comparing phase of the sinusoidal current at the piezoelectric vibrating means with phase of voltage at the secondary winding means of the transformer means to produce a phase difference signal, and means for controlling frequency of the driving current in accordance with the phase difference signal.

2. A driving circuit in accordance with claim 1 in which said phase comparator means includes means for detecting a first timing in said voltage at the secondary winding means of said transformer means which corresponds to a timing in which said transistor means is turned from ON state to OFF state and a second timing in which said current at said piezoelectric vibrating means is increased and crosses a zero value line, and means for controlling the frequency of the driving current so that said first and second timings coincide each other.

3. A driving circuit in accordance with claim 1 in which said phase comparator means includes means for detecting a first timing in said voltage at the secondary winding means of said transformer means which corresponds to a timing in which said transistor means is turned from OFF state to ON state and a second timing in which said current at said piezoelectric vibrating means is decreased and crosses a zero value line, and means for controlling the frequency of the driving current so that said first and second timings coincide each other.

4. A driving circuit in accordance with claim 1 in which said transistor drive means and said frequency control means are in the form of an oscillator which is integrally formed with said phase comparator means in an integrated circuit.

5. A driving circuit in accordance with claim 1 in which said primary winding means of said transformer means is connected with reset winding means which is connected with diode means for clamping a voltage which is produced in said reset winding means due to a reverse electromotive power of said piezoelectric vibrating means.

6. A driving circuit for a piezoelectric vibrator including transformer means having primary winding means and secondary winding means comprising a single transistor, switching transistor means connected in series with said primary winding means, piezoelectric vibrating means connected with said secondary winding means, transistor driving means for applying driving current to said switching transistor means so that the switching transistor means is alternately turned on and off to thereby drive said vibrating means at or in the vicinity of a resonating frequency of the vibrating means, the improvement comprises means for converting voltage across said secondary winding means of said transformer means into a sinusoidal form so that current and voltage of sinusoidal form are applied to the vibrating means, phase comparator means for comparing phase of the sinusoidal current at the piezoelectric vibrating means with phase of voltage at the secondary winding means of the transformer means to produce a phase difference signal, and means for controlling frequency of the driving current in accordance with the phase difference signal.

7. A driving circuit for a piezoelectric vibrator including a transformer having a primary winding and a secondary winding, a single switching transistor connected in series with said primary winding, said piezoelectric vibrator being connected with said secondary winding, transistor driving means for applying driving current to said switching transistor so that the switching transistor is alternately turned on and off to thereby drive said vibrator at or in the vicinity of a resonating frequency of the vibrator, coil means connected in series with the piezoelectric vibrator so that current and voltage of sinusoidal form are applied to the vibrator, phase comparator means for comparing phase of the sinusoidal current at the piezoelectric vibrator with phase of voltage at the secondary winding of the transformer to produce a phase difference signal, and means for controlling frequency of the driving current in accordance with the phase difference signal.

* * * * *